United States Patent
Nishiyama (10) Patent No.: US 11,626,749 B2
(45) Date of Patent: Apr. 11, 2023

(54) PHOTOVOLTAIC SYSTEM

(71) Applicant: KANEKA CORPORATION, Osaka (JP)

(72) Inventor: Haruo Nishiyama, Settsu (JP)

(73) Assignee: KANEKA CORPORATION, Osaka (JP)

(*) Notice: Subject to any disclaimer, the term of this patent is extended or adjusted under 35 U.S.C. 154(b) by 352 days.

(21) Appl. No.: 16/962,488

(22) PCT Filed: Sep. 11, 2018

(86) PCT No.: PCT/JP2018/033641
§ 371 (c)(1),
(2) Date: Jul. 15, 2020

(87) PCT Pub. No.: WO2019/142392
PCT Pub. Date: Jul. 25, 2019

(65) Prior Publication Data
US 2021/0083503 A1    Mar. 18, 2021

(30) Foreign Application Priority Data

Jan. 16, 2018  (JP) .............................. JP2018-004872

(51) Int. Cl.
*H02J 7/35* (2006.01)
*H02S 10/20* (2014.01)
(Continued)

(52) U.S. Cl.
CPC ................ *H02J 7/35* (2013.01); *H02S 10/20* (2014.12); *H02S 40/30* (2014.12); *H02S 50/00* (2013.01)

(58) Field of Classification Search
CPC ...... H02J 7/35; H02J 1/102; H02J 7/34; H02J 3/38; H02J 2300/24; H02S 10/20;
(Continued)

(56) References Cited

U.S. PATENT DOCUMENTS

2008/0143292 A1* 6/2008 Ward ..................... B60L 8/003
320/101
2008/0211316 A1* 9/2008 Watanabe ............. H02M 3/158
307/110
(Continued)

FOREIGN PATENT DOCUMENTS

JP    2002238164 A    8/2002
JP    2013004566 A    1/2013
(Continued)

*Primary Examiner* — Michael Y Sun
(74) *Attorney, Agent, or Firm* — Alleman Hall Creasman & Tuttle LLP (57) ABSTRACT

Provided is a photovoltaic system wherein potential induced degradation (PID) is simply and efficiently suppressed. This photovoltaic system is provided with a bypass electric path that connects an inverter and a positive electrode of a solar cell module array to each other by being connected in parallel to a first electric path between the inverter and the solar battery module array. The bypass electric path is provided with a second switching circuit, and a first switching circuit is provided to an electric path between the inverter and a negative electrode of the solar cell module array, the electric path being a part of the first electric path.

3 Claims, 10 Drawing Sheets

(51) Int. Cl.
*H02S 40/30* (2014.01)
*H02S 50/00* (2014.01)

(58) Field of Classification Search
CPC .......... H02S 40/30; H02S 50/00; H02S 50/10; H01L 31/02021; H01L 31/048; Y02E 10/56; Y02E 70/30
See application file for complete search history.

(56) References Cited

U.S. PATENT DOCUMENTS

2011/0162689 A1* 7/2011 Ueda ...................... H02S 20/23
136/244
2017/0353155 A1 12/2017 Hackl et al.

FOREIGN PATENT DOCUMENTS

JP 2014099438 A 5/2014
JP 6148782 B1 6/2017

* cited by examiner

PHOTOVOLTAIC SYSTEM

TECHNICAL FIELD

The present invention relates to a photovoltaic system.

BACKGROUND ART

Recently, potential induced degradation (PID), which is degradation (drop in power generation) of a solar cell module, has become a problem (see Patent Documents 1 and 2). PID is a drop in power generation efficiency caused by degradation of a photoelectric conversion substrate of a solar cell module.

A possible cause of PID is that during operation of a solar cell module under a high voltage, sodium ions (Na+) contained in a glass substrate of the solar cell module diffuse and infiltrate an electrode of a solar cell whose potential has become negative and finally diffuse and infiltrate a photoelectric conversion substrate of the solar cell.

In view of this, a photovoltaic system described in Patent Document 1 electrically isolates a solar cell module by using a switching circuit to prevent application of a voltage to a solar cell while the solar cell module is not generating power. This makes it difficult for the potential of the solar cell to become negative, thereby making it difficult for PID to occur.

A photovoltaic system described in Patent Document 2 applies a voltage to a negative electrode of a solar cell module by using a direct-current power source to prevent sodium ions from diffusing and infiltrating a photoelectric conversion substrate while the solar cell module is not generating power. This makes the potential to ground of the negative electrode of the solar cell positive. As a result, sodium ions are less attracted, and thereby PID becomes less likely to occur.

Patent Document 1: Japanese Patent No. 6148782
Patent Document 2: Japanese Unexamined Patent Application, Publication No. 2013-004566

DISCLOSURE OF THE INVENTION

Problems to be Solved by the Invention

However, the technique of Patent Document 1 is not sufficient to prevent PID since a positive voltage, which is a reverse bias, is not applied, unlike the technique of Patent Document 2. Meanwhile, the technique of Patent Document 2 requires a direct-current power source separate from a power conditioner for the photovoltaic system and therefore requires high cost and complex circuit design.

The present invention was accomplished to solve the above problems. An object of the present invention is to provide a photovoltaic system in which PID is less likely to occur simply and efficiently.

Means for Solving the Problems

A photovoltaic system according to the present invention includes a solar cell module array, a rechargeable battery that stores therein power supplied from the solar cell module array or a system power source, and a power conditioner electrically connected to the solar cell module array and the rechargeable battery. The photovoltaic system is configured such that the power conditioner includes an inverter that converts a direct current supplied from the solar cell module array or a direct current supplied from the rechargeable battery into an alternating current, and a bypass electric path that connects the inverter and a positive electrode of the solar cell module array is connected in parallel with a first electric path between the inverter and the solar cell module array. A voltage application circuit that induces a potential of the positive electrode of the solar cell module array toward a positive potential at least while the solar cell module array is not generating power and the rechargeable battery is operating is provided on the bypass electric path, and a first switching circuit that is in an opened state while the solar cell module array is not generating power and the rechargeable battery is operating is provided on an electric path that is a part of the first electric path and that is located between the inverter and a negative electrode of the solar cell module array.

Effects of the Invention

According to the photovoltaic system according to the present invention, PID can be made less likely to occur simply and efficiently.

PREFERRED MODE FOR CARRYING OUT THE INVENTION

An embodiment of the present invention is described below, but the present invention is not limited to this. For convenience of description, reference signs and other descriptions may be omitted. In such cases, other drawings should be referred to.

Figure 1:
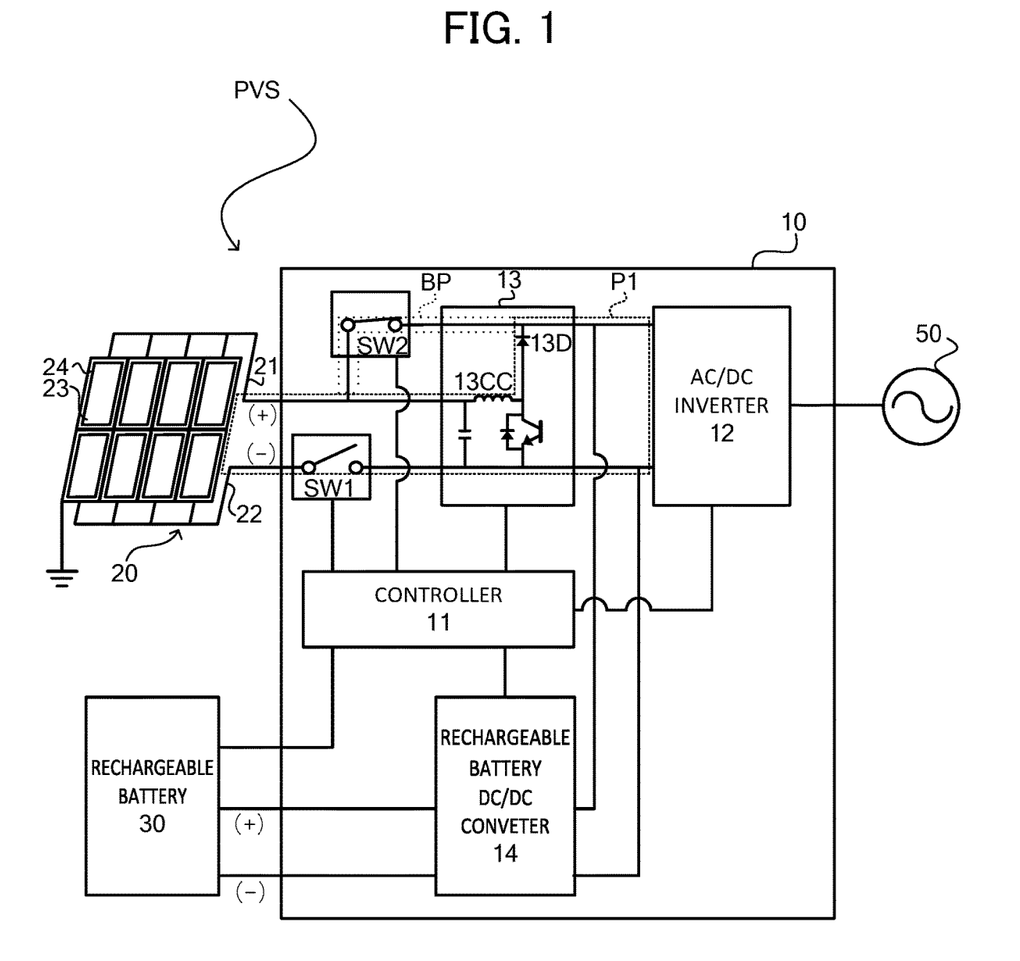
FIG. 1 is a block diagram of a photovoltaic system.

FIG. 1 is a block diagram illustrating a photovoltaic system PVS. As illustrated in FIG. 1, the photovoltaic system PVS is a collection of a plurality of devices electrically connected to a system power source 50. Specifically, the photovoltaic system PVS includes at least a solar cell module array 20, a rechargeable battery 30, and a power conditioner 10.

Figure 9:
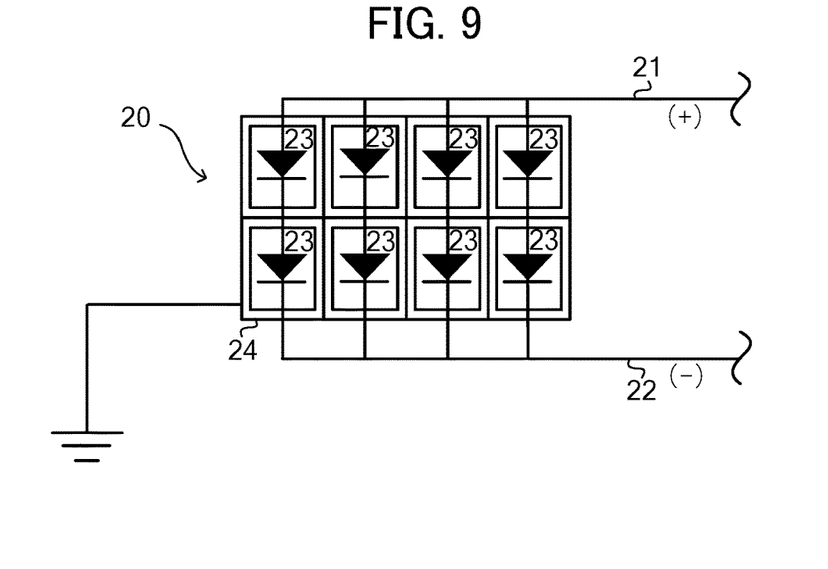
FIG. 9 illustrates a configuration of a solar cell module array.

The solar cell module array 20 includes a plurality of solar cell modules 23. Although the way in which the solar cell modules 23 are electrically connected to one another may be a serial connection, a parallel connection, or a series-parallel connection, the following discusses the series-parallel connection as an example. Specifically, pairs of solar cell modules 23 that are electrically connected in series are connected in parallel as illustrated in FIG. 9. Although a plurality of solar cells are disposed in each of the solar cell modules 23, the plurality of solar cells are expressed by a single diode for convenience of illustration.

A metal frame 24 of the solar cell modules 23 is grounded to ensure safety from risks such as electric shock and electric leakage. The solar cell modules 23 are provided with a positive electrode 21 and a negative electrode 22 for electrical connection with the power conditioner 10.

Figure 10:
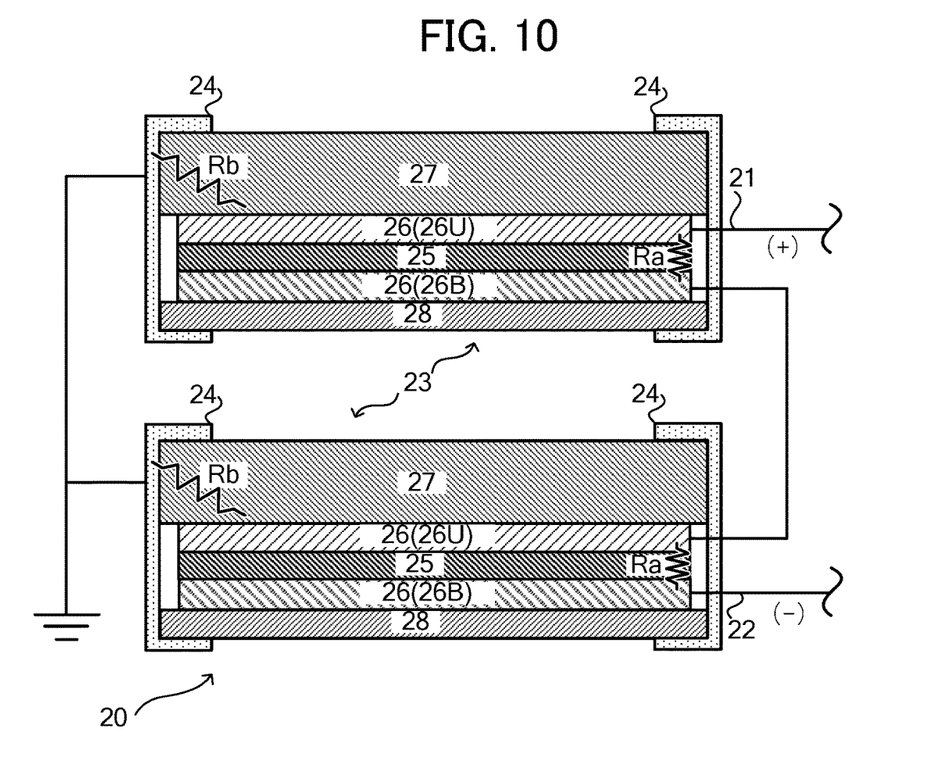
FIG. 10 is an explanatory view schematically illustrating solar cells in the electric circuit diagram illustrated in FIG. 9.

Although the solar cell modules 23 are not limited to a specific type, the following discusses an example in which the solar cell modules 23 are solar cell modules including thin-film solar cells. As illustrated in the simplified diagram of FIG. 10, the solar cell modules 23 each include a photoelectric conversion substrate 25, which is formed by layering a photoelectric conversion layer on a substrate such as a glass substrate, pinching electrodes 26 (a light-receiving-side pinching electrode 26U and a back-side pinching electrode 26B) that pinch the photoelectric conversion substrate 25 and collect carriers generated in the photoelectric conversion substrate 25, a light-receiving-side protection member 27 that protects a light receiving side of the solar cell module 23, and a back-side protection member 28 that protects a back side of the solar cell module 23. The solar cell modules 23 are electrically connected to one another through an electrically conductive member (e.g., a connection wire).

The light-receiving-side protection member 27 is preferably made of a material having high light transmission. The light-receiving-side protection member 27 is, for example, a glass substrate. The following discusses an example in which the light-receiving-side protection member 27 is a glass substrate 27. Furthermore, the solar cell modules 23 use a sealing material for sealing the photoelectric conversion substrate 25 and the pinching electrodes 26U and 26B sandwiched between the light-receiving-side protection member 27 and the back-side protection member 28, but illustration of the sealing material in the drawings is omitted for convenience of illustration.

A potential to ground generated by a voltage applied to the solar cell module 23 on the positive electrode 21 side and the solar cell module 23 on the negative electrode 22 side in the solar cell module array 20 will be described later. In the description, the photoelectric conversion substrate 25, which serves as a resistor while the solar cell modules 23 are not generating power, is expressed as "Ra" and a resistor between the glass substrate 27 and the metal frame 24 is expressed as "Rb."

The rechargeable battery 30 is a battery that stores therein power generated by the solar cell module array 20 or power supplied from the system power source 50. The rechargeable battery 30 is not limited to a specific type and can be, for example, a lead battery, a nickel-metal-hydride battery, or a lithium-ion battery.

The power conditioner 10 enables the solar cell module array 20 and the rechargeable battery 30 to be electrically connected in parallel and is electrically connected in series with the system power source 50. The power conditioner 10 transforms or converts power of the solar cell module array 20 or the rechargeable battery 30 in conformity with the system voltage or transforms or converts power of the system power source 50 in conformity with the rechargeable battery.

That is, the power conditioner 10 is not a power conditioner exclusive for the solar cell module array 20 or the rechargeable battery 30 but a hybrid power conditioner 10 that appropriately adjusts power and voltage concerning both of the devices 20 and 30. The power conditioner 10 is a non-insulation type (transformer-less) power conditioner.

To realize the above function, the power conditioner 10 includes a controller 11, an AC/DC inverter (hereinafter referred to as an inverter) 12, a solar cell module array DC/DC converter (hereinafter referred to as a solar cell converter) 13, a rechargeable battery DC/DC converter (hereinafter referred to as a rechargeable battery converter) 14, a first switching circuit SW1, and a second switching circuit SW2.

The controller 11 collectively controls various operations of members such as the inverter 12, the solar cell converter 13, the rechargeable battery converter 14, the first switching circuit SW1, the second switching circuit SW2, and the rechargeable battery 30.

The controller 11 is, for example, an arithmetic processor such as a central processing unit (CPU) or a digital signal processor (DSP). Various functions of the controller 11 may be realized by execution of predetermined software (a program or an application) stored, for example, in a storage device (not illustrated) or may be realized by hardware in combination with software, or may be realized by hardware (an electronic circuit) only.

As illustrated in FIG. 1, the controller 11 may be provided in the power conditioner 10 or may be separately provided outside the power conditioner 10.

The inverter 12 is a converter (bidirectional inverter) that converts direct-current power into alternating-current power or that converts alternating-current power into direct-current power.

As an example of conversion of direct-current power into alternating-current power, direct-current power generated by the solar cell module array 20 or direct-current power stored in the rechargeable battery 30 is converted into alternating-current power for household use, or direct-current power of the solar cell module array 20 is converted into alternating-current power to be transmitted to the system power source 50 and then be sold. As an example of conversion of alternating-current power into direct-current power, alternating-current power supplied from the system power source 50 is converted into direct-current power to charge the rechargeable battery 30.

Accordingly, the inverter 12 is disposed on an electric path between the system power source 50 and the solar cell module array 20 and on an electric path between the system power source 50 and the rechargeable battery 30.

Although a bidirectional inverter has been described above as an example of the inverter 12, the inverter 12 is not limited to this and may be a unidirectional (one-way) inverter.

Figure 4:
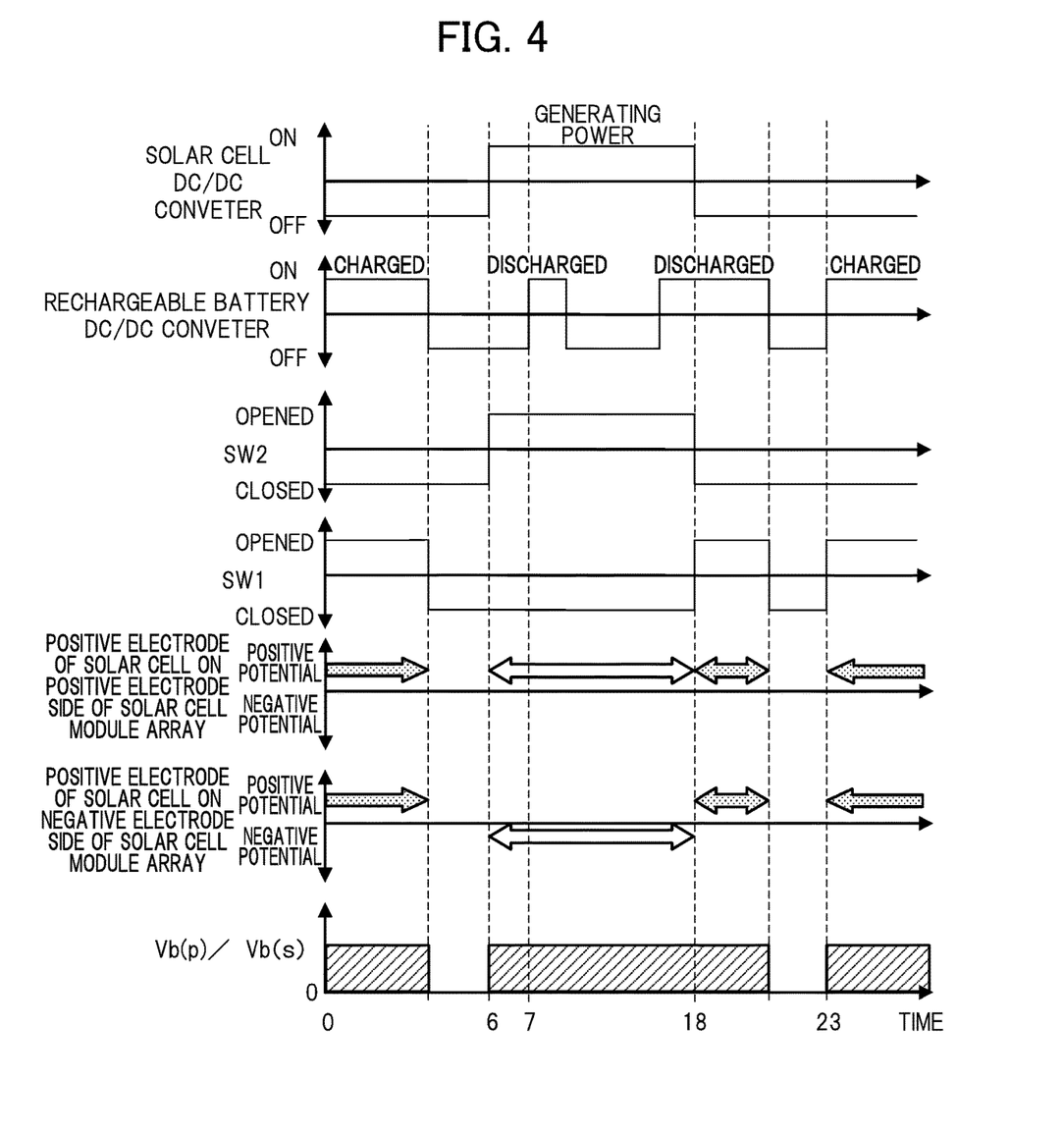
FIG. 4 is a timing diagram of the photovoltaic system of FIG. 1.

The solar cell converter 13 is a transformer for efficient extraction of direct-current power generated by the solar cell module array 20 and for adjustment to a voltage suitable for conversion in the inverter 12. Accordingly, the solar cell converter 13 is disposed on an electric path between the solar cell module array 20 and the inverter 12. The solar cell converter 13 operates in a time window in which the solar cell module array 20 is generating power (see FIG. 4).

As illustrated in FIG. 1, the solar cell converter 13 includes a diode [rectifying device] 13D and prevents an electric current from flowing from the inverter 12 to the solar cell module array 20 while allowing an electric current to flow from the solar cell module array 20 to the inverter 12.

The power conditioner 10 is a non-insulation type (transformer-less) power conditioner 10. Accordingly, the system power source 50 is electrically connected to the solar cell module array 20 through the power conditioner 10 without being insulated. In particular, the negative electrode 22 of the solar cell module array 20 is electrically connected to the system power source 50 through the solar cell converter 13 and the inverter 12 without being insulated.

The rechargeable battery converter 14 is a transformer for adjusting direct-current power stored in the rechargeable battery 30 to a voltage suitable for conversion in the inverter 12 to discharge the rechargeable battery 30 and is a transformer for adjusting direct-current power supplied from the system power source 50 through the inverter 12 to a voltage suitable for charging or adjusting direct-current power supplied from the solar cell module array 20 through the solar cell converter to a voltage suitable for charging. Accordingly, the rechargeable battery converter 14 is disposed on an electric path between the rechargeable battery 30 and the inverter 12. The rechargeable battery converter 14 operates in a time window in which the rechargeable battery 30 is being charged or discharged (see FIG. 4).

As illustrated in FIG. 1, for convenience of description, the electric path between the inverter 12 and the solar cell module array 20 is referred to as a first electric path P1. The solar cell module array 20 is electrically connected in series with a part between the inverter 12 and the solar cell module array 20. The rechargeable battery converter 14 is electrically connected in parallel with the first electric path P1. More specifically, the rechargeable battery converter 14 is electrically connected in parallel with an electric path that is a part of the first electric path P1 and that is located between the inverter 12 and the solar cell converter 13.

Furthermore, the first switching circuit SW1 is provided on an electric path that is a part of the first electric path P1 and that is located between the inverter 12 (more specifically the solar cell converter 13) and the negative electrode 22 of the solar cell module array 20.

In the photovoltaic system PVS, an electric path that connects the inverter 12 (more specifically the solar cell converter 13) and the positive electrode 21 of the solar cell module array 20 is electrically connected in parallel with the first electric path P1. This electric path is an electric path connected between a choke coil 13CC of the solar cell converter 13 and the solar cell module array 20 from a cathode side of the diode 13D of the solar cell converter 13, for example, in a case where the solar cell converter 13 is a chopper-type DC/DC converter.

This electric path is referred to as a bypass electric path BP, and the second switching circuit [voltage application circuit] SW2 is provided on the bypass electric path BP.

The first switching circuit SW1 and the second switching circuit SW2 are not limited to a specific type and can be, for example, a direct current relay (DC relay) that has a mechanical contact point.

Figure 15:
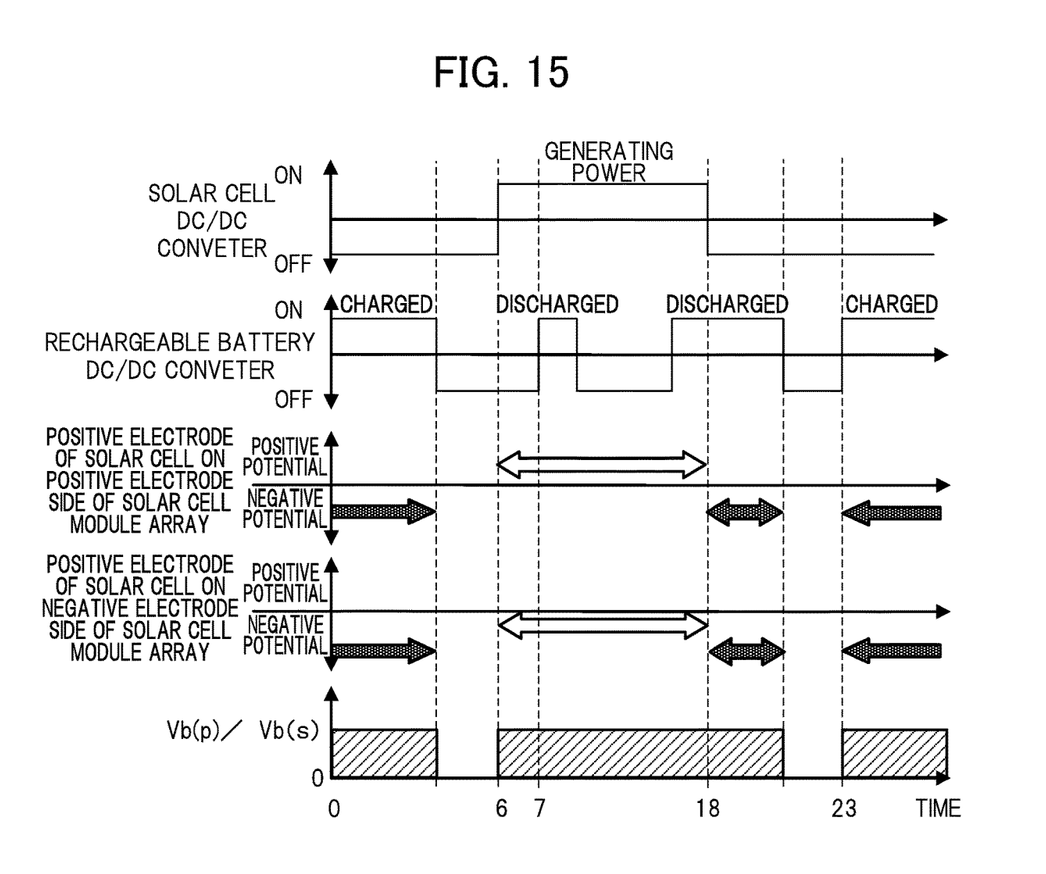
FIG. 15 is a timing diagram of the photovoltaic system according to the comparative example.

The first switching circuit SW1 and the second switching circuit SW2 are described below with reference to a comparative example (FIGS. 11 to 14) in which these switching circuits are not provided and a timing diagram (FIG. 15) concerning operation of a solar cell module and a rechargeable battery.

Although the first switching circuit SW1 and the second switching circuit SW2 are described by using specific examples of numerical values as needed for easy understanding, these examples of numerical values are approximate values, and the present invention is not limited to these examples of numerical values. These examples of numerical values (examples of values of voltage and potential) change in various ways depending on environmental conditions. As reference signs for the comparative example, numbers in the 100s corresponding to those in other drawings are used to avoid confusion.

Figure 11:
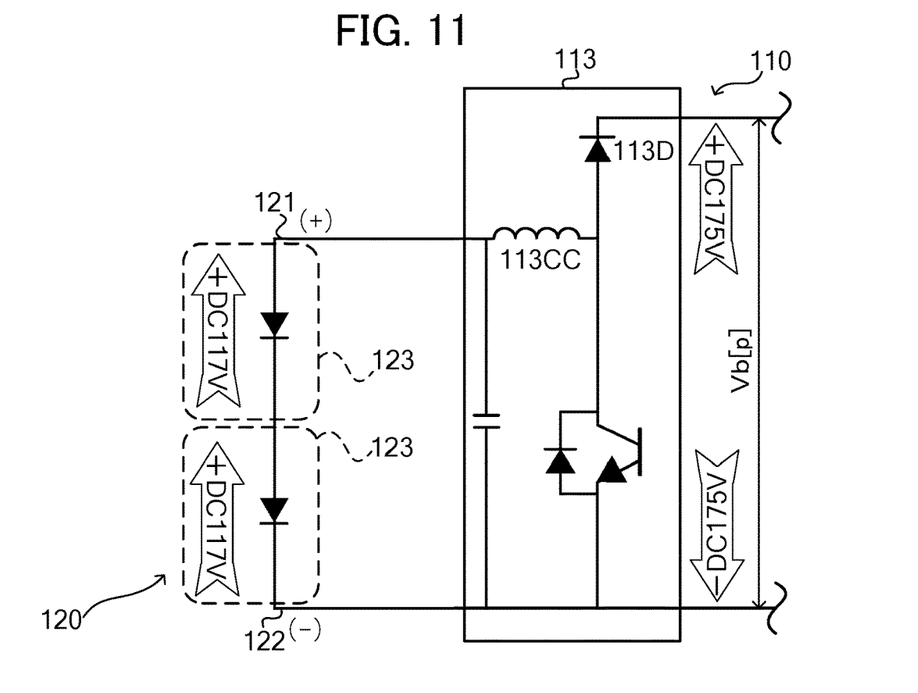
FIG. 11 is an electric circuit diagram of a part of a photovoltaic system according to a comparative example (while a solar cell converter is operating).

First, the comparative example is described. FIG. 11 is an electric circuit diagram in a time window in which a solar cell module array 120 is generating power in the comparative example. In a case where the solar cell module array 120 is generating power, a solar cell converter 113 and an inverter (not illustrated) operate. Accordingly, the solar cell converter 113 transforms a voltage of direct-current power of the solar cell module array 120 to a voltage suitable for operation of the inverter. An electric path is connected between a choke coil 113CC of the solar cell converter 113 and the solar cell module array 120 from a cathode side of the diode 113D of the solar cell converter 113.

This transformed voltage, that is, a value (Vb[p]) transformed by the solar cell converter 113 is, for example, 350 V DC. Since this base voltage Vb[p] is designed to become $-(\frac{1}{2})\times Vb[p]$ and $+(\frac{1}{2})\times Vb[p]$ with respect to a ground potential (earth), a positive-electrode-side voltage to ground +175 V DC becomes applicable to a positive electrode 121 (more specifically a diode 113D) of the solar cell module array 120, and a negative-electrode-side voltage to ground −175 V DC becomes applicable to a negative electrode 122 of the solar cell module array 120.

However, in a case where the solar cell module array 120 is generating power, a potential to ground is offset by a voltage generated by the power generation. For example, in a case where +117 V DC is generated in each of two solar cell modules 123 that are connected in series, a potential difference of +234 V DC(=+2×117 V) is generated between the positive electrode 121 and the negative electrode 122 of the solar cell module array 120. A metal frame 124 of the solar cell modules 123 is grounded to ensure safety from risks such as electric shock and electric leakage.

Figure 12:
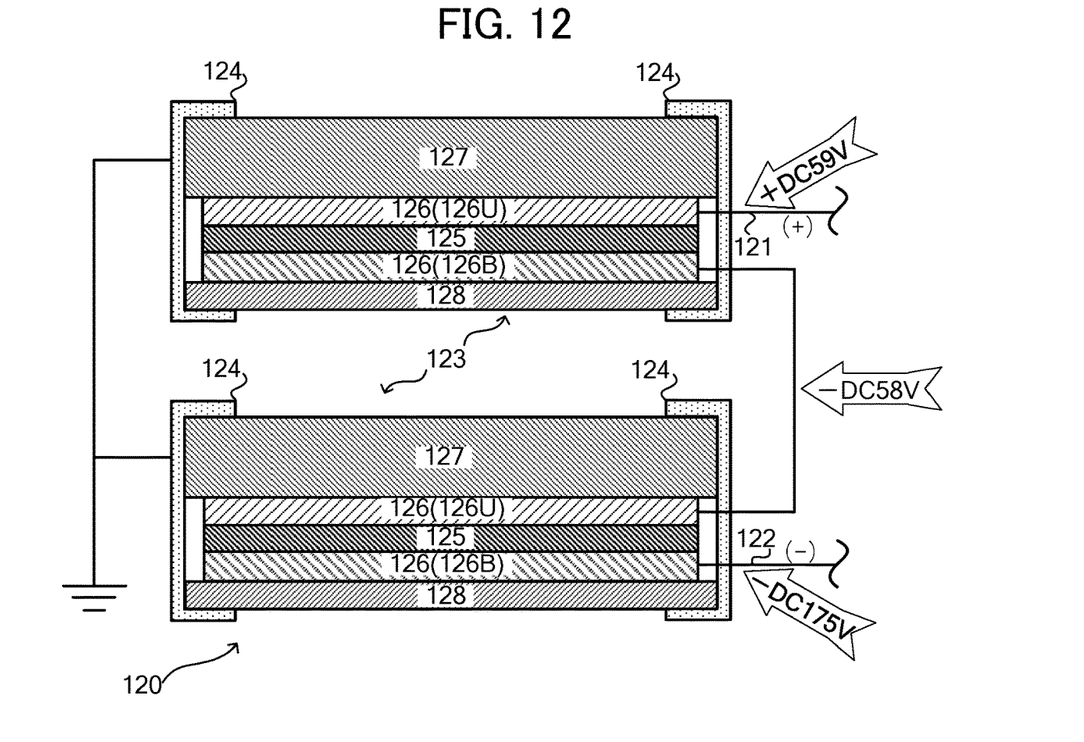
FIG. 12 is an explanatory view schematically illustrating solar cells in the electric circuit diagram illustrated in FIG. 11 (the comparative example).

Since the power generation voltage of the solar cells is added to the negative-electrode-side voltage to ground −175 V DC applied to the negative electrode 122 of the solar cell module array 120, a light-receiving-side pinching electrode 126U of the solar cell module 123 on the negative electrode 122 side of the solar cell module array 120 is −58 V DC (=−175 V +117 V), and a light-receiving-side pinching electrode 126U of the solar cell module 123 on the positive electrode 121 side of the solar cell module array 120 is +59 V DC(=−58 V+117 V) as illustrated in FIG. 12. Pinching electrodes 126 (the light-receiving-side pinching electrode 126U and a back-side pinching electrode 126B) pinch a photoelectric conversion substrate 125 and collect carriers generated in the photoelectric conversion substrate 125. A back-side protection member 128 protects a back side of the solar cell module 123.

A glass substrate 127 contains sodium carbonate ($Na_2CO_3$). Accordingly, the negative voltage applied to the positive electrode side of the solar cell module 123 on the negative electrode 122 side of the solar cell module array 120 draws sodium ions (Na+) in the glass substrate 127 toward the light-receiving-side pinching electrode 126U and to the photoelectric conversion substrate 125. If sodium ions are excessively drawn to the pinching electrode 126 or the photoelectric conversion substrate 125, PID occurs. However, in a case where the negative potential is relatively low (e.g., −58 V DC in the above case), it is difficult for PID to occur.

Figure 13:
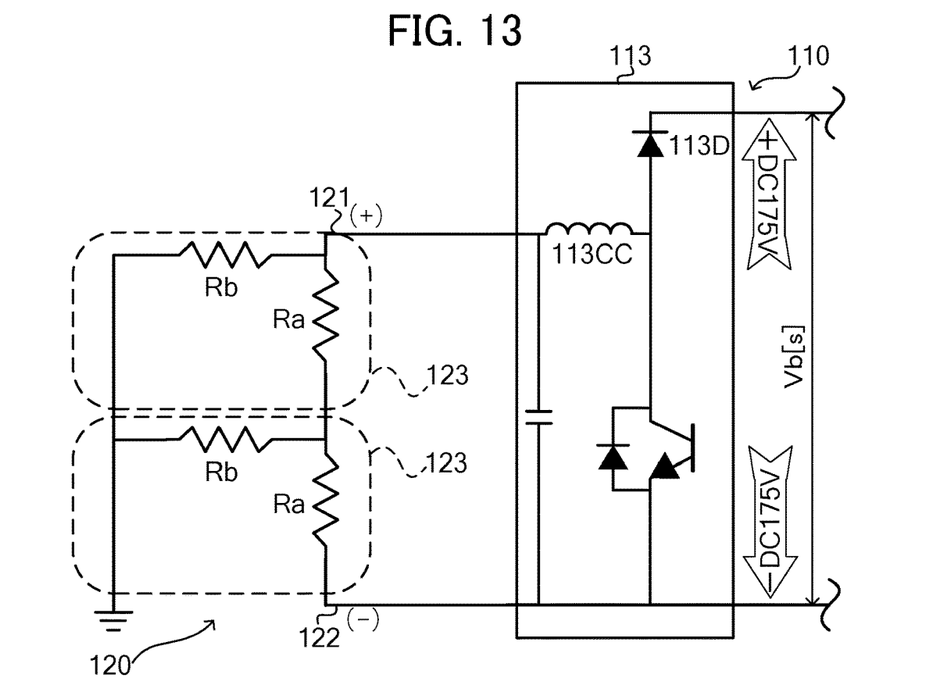
FIG. 13 is an electric circuit diagram of a part of the photovoltaic system according to the comparative example (while the solar cell converter is not operating and a rechargeable battery converter is operating).
Figure 14:
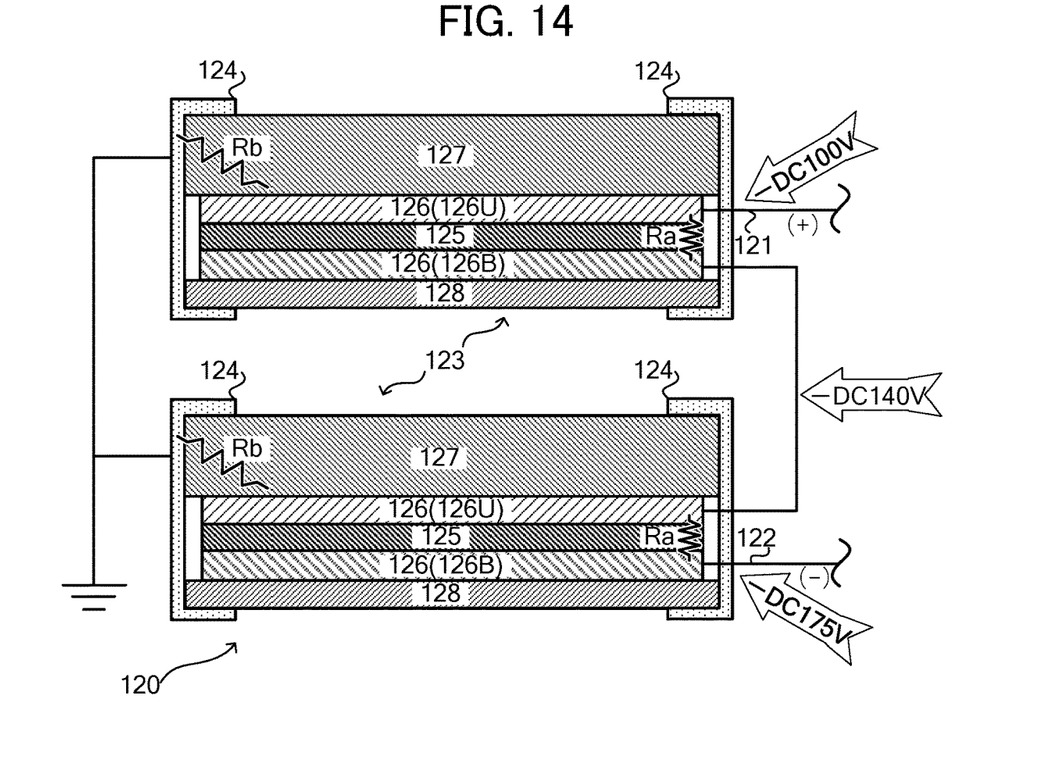
FIG. 14 is an explanatory view schematically illustrating solar cells in the electric circuit diagram illustrated in FIG. 13 (the comparative example).

Meanwhile, FIG. 13 illustrates an electric circuit diagram in a case where a rechargeable battery (not illustrated) is being charged or discharged in a time window (see FIG. 15) in which the solar cell module array 120 is not generating power.

In a case where the rechargeable battery is being charged or discharged, a rechargeable battery converter (not illustrated) and the inverter (not illustrated) operate. That is, the rechargeable battery converter transforms a voltage of direct-current power stored in the rechargeable battery to a voltage suitable for operation of the inverter to discharge the rechargeable battery. Furthermore, the rechargeable battery converter for transforms a voltage of direct-current power to charge the rechargeable battery with direct-current power converted from alternating-current power by the inverter.

This transformed voltage, that is, a value (Vb[s]) transformed by the rechargeable battery converter is, for example, 350 V DC. Since this base voltage Vb[s] is designed to become −(½)×Vb[s] and +(½)×Vb[s] with respect to the ground potential as in the case of the base voltage Vb[p], a positive-electrode-side voltage to ground +175 V DC is applicable to the positive electrode 121 (more specifically the diode 113D) of the solar cell module array 120, and a negative-electrode-side voltage to ground −175 V DC is applicable to the negative electrode 122 of the solar cell module array 120, as illustrated in FIG. 13.

The offset described above does not occur since the solar cell module array 120 is not generating power. Accordingly, due to the voltage applied to the negative electrode 122 of the solar cell module array 120, the light-receiving-side pinching electrode 126U of the solar cell module 123 on the negative electrode 122 side of the solar cell module array 120 and the light-receiving-side pinching electrode 126U of the solar cell module 123 on the positive electrode 121 side of the solar cell module array 120 have a relatively high negative potential.

Actual measurement shows that the negative potential of the light-receiving-side pinching electrode 126U of the solar cell module 123 on the negative electrode 122 side of the solar cell module array 120 is −140 V DC and the negative potential of the light-receiving-side pinching electrode 126U of the solar cell module 123 on the positive electrode 121 side of the solar cell module array 120 is −100 V DC. Such a relatively high negative potential strongly draws sodium ions (Na+) in the glass substrate 127 toward the pinching electrode 126 and the photoelectric conversion substrate 125. Therefore, PID occurs.

Compared with the comparative example, the power conditioner 10 in the photovoltaic system PVS illustrated in FIG. 1 includes the first switching circuit SW1 and the second switching circuit SW2.

The first switching circuit SW1 is disposed on an electric path that is a part of the first electric path P1 between the inverter 12 and the solar cell module array 20 and that is located between the inverter 12 (more specifically the solar cell converter 13) and the negative electrode 22 of the solar cell module array 20.

The first switching circuit SW1 is in an "opened" state while the solar cell module array 20 is not generating power and the rechargeable battery 30 is operating (being charged or discharged). Meanwhile, the first switching circuit SW1 is in a "closed" state in other cases, that is, while the solar cell module array 20 is generating power and the rechargeable battery 30 is not operating or is operating or while the solar cell module array 20 is not generating power and the rechargeable battery 30 is not operating.

The second switching circuit SW2 is disposed on a bypass electric path that connects the inverter 12 and the positive electrode 21 of the solar cell module array 20.

The second switching circuit SW2 is in a "closed" state while the solar cell module array 20 is not generating power and the rechargeable battery 30 is operating (is being charged or discharged) and is also in a "closed" state while the solar cell module array 20 is not generating power and the rechargeable battery 30 is not operating. In other words, the second switching circuit SW2 is in a "closed" state at least while the solar cell module array 20 is not generating power and the rechargeable battery 30 is operating (is being charged or discharged). Meanwhile, the second switching circuit SW2 is in an "opened" state while the solar cell module array 20 is generating power.

Opening-closing operation of the first switching circuit SW1 and the second switching circuit SW2 is controlled by the controller 11. More specifically, the controller 11 controls the first switching circuit SW1 to open and controls the second switching circuit SW2 to close upon detection of an OFF signal of the solar cell converter 13 and an ON signal of the rechargeable battery converter 14 as, for example, in the timing diagram of FIG. 4.

Furthermore, the controller 11 controls the first switching circuit SW1 to "close" and controls the second switching circuit SW2 to "open" upon detection of an ON signal of the solar cell converter 13.

Furthermore, the controller 11 controls the first switching circuit SW1 to "close" and controls the second switching circuit SW2 to "close" upon detection of an OFF signal of the solar cell converter 13 and an OFF signal of the rechargeable battery converter 14. Note, however, that how the first switching circuit SW1 and the second switching circuit SW2 operate upon detection of an OFF signal of the solar cell converter 13 and an OFF signal of the rechargeable battery converter 14 is not limited to this, and the controller 11 may control the first switching circuit SW1 to "open" and control the second switching circuit SW2 to "close."

This is because the base voltage Vb has no influence irrespective of whether the first switching circuit SW1 is in an "opened" state or a "closed" state since the base voltage Vb is not generated as long as the converters 13 and 14 and the inverter 12 are not operating. Note that in a case where the first switching circuit SW1 is a DC relay (normally open type), the first switching circuit SW1 is preferably controlled to "open" because electric power consumption is kept lower.

As described above, the first switching circuit SW1 and the second switching circuit SW2 are disposed, the first switching circuit SW1 is in an "opened" state while the solar cell module array 20 is not generating power and the rechargeable battery 30 is operating and the second switching circuit SW2 is in a "closed" state while the solar cell module array 20 is not generating power and the rechargeable battery 30 is operating. This makes it difficult for PID, which occurs in the comparative example, to occur, as described below.

Figure 2:
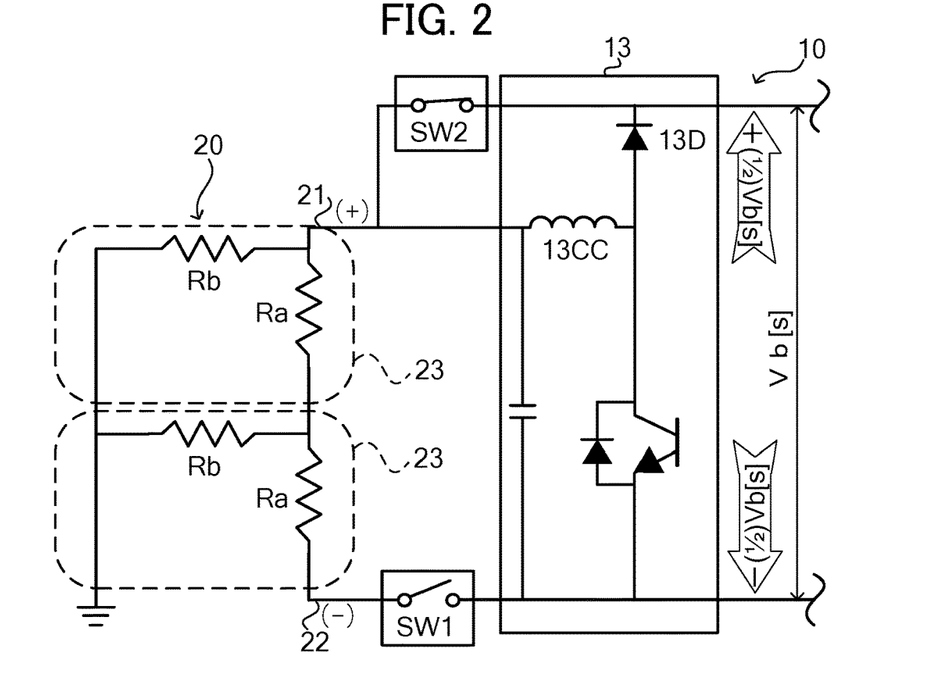
FIG. 2 is an electric circuit diagram of a part of the photovoltaic system of FIG. 1 (while the solar cell converter is not operating and the rechargeable battery converter is operating).

As illustrated in FIG. 2, the rechargeable battery converter for (not illustrated) operates, and a base voltage Vb[s] is generated. However, the first switching circuit SW1 is in an "opened" state while the rechargeable battery converter 14 is operating, for example, while the solar cell module array 20 is not generating power and the rechargeable battery 30 is being charged or discharged. Accordingly, a negative-electrode-side voltage to ground −(½)×Vb[s] of the base voltage Vb[s] is not applied to the negative electrode 22 of the solar cell module array 20.

Meanwhile, the second switching circuit SW2 is in a "closed" state while the solar cell module array 20 is not generating power and the rechargeable battery 30 is being charged or discharged. Accordingly, a positive-electrode-side voltage to ground +(½)×Vb[s] of the base voltage Vb[s] is applied to the positive electrode 21 of the solar cell module array 20.

The applied voltage is applied to the resistor Rb (the resistor between the glass substrate 27 and the metal frame 24) of the solar cell module 23 on the positive electrode 21 side of the solar cell module array 20 and to the resistor Rb of the solar cell module 23 on the negative electrode 22 side of the solar cell module array 20 that is connected in series with the resistor Ra (the resistor of the photoelectric conversion substrate 25) of the solar cell module 23 on the positive electrode 21 side.

Figure 3:
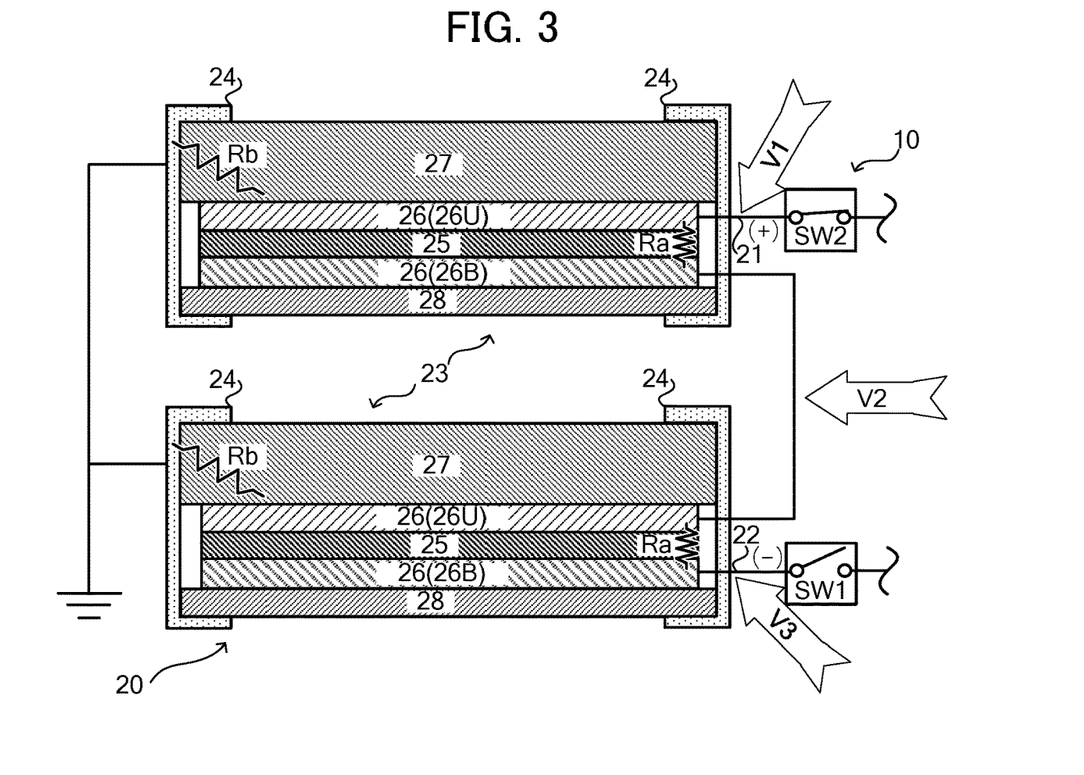
FIG. 3 is an explanatory view schematically illustrating solar cells in the electric circuit diagram illustrated in FIG. 2.

Accordingly, V1 is a potential based on the voltage applied to the light-receiving-side pinching electrode 26U of the solar cell module 23 on the positive electrode 21 side of the solar cell module array 20, V2 is a potential based on a voltage applied to the light-receiving-side pinching electrode 26U of the solar cell module 23 on the negative electrode 22 of the solar cell module array 20, and V3 is a potential based on a voltage applied to the negative electrode 22 of the solar cell module 23 on the negative electrode 22 side in the solar cell module array 20, as illustrated in FIG. 3.

$$V1 = +(½) \times Vb[s]$$

$$V2 = +(½) \times Vb[s] \times (Rb/(Ra+Rb))$$

$$V3 = +(½) \times Vb[s] \times (Rb/(Ra+Rb))$$

Since the first switching circuit SW1 is in an "opened" state, no electric current flows through the solar cell module 23 on the negative electrode 22 side of the solar cell module array 20. Accordingly, V3 on the negative electrode side of the solar cell module 23 on the negative electrode 22 side is the same as V2. Actual measurement shows that V1 is +175 V DC and V2 and V3 are +160 V DC in a case where Vb[s] is 350 V.

As described above, in a case where the first switching circuit SW1 and the second switching circuit SW2 are disposed, the first switching circuit SW1 is in an "opened" state and the second switching circuit SW2 is in a "closed" state while the solar cell module array 20 is not generating power and the rechargeable battery 30 is operating, and as a result the potential of the positive electrode 21 of the solar cell module array 20 becomes positive. In such a case where the potential of the positive electrode 21 of the solar cell module array 20 is positive, the potential of the light-receiving-side pinching electrodes 26U of the plurality of solar cell modules 23 of the solar cell module array 20 also becomes positive. As a result, the light-receiving-side pinching electrodes 26U do not draw sodium ions (Na+) of the glass substrate 27, and thereby PID becomes less likely to occur.

In other words, although the potential of the positive electrode 21 of the solar cell module array 20 becomes negative in a photovoltaic system in which the first switching circuit and the second switching circuit are not disposed, the second switching circuit SW2 efficiently serves a function of induction (voltage application) toward a positive potential. In this respect, the second switching circuit SW2 can be called a voltage application circuit.

In a case where the solar cell module array 20 is generating power, a relatively low negative voltage is applied to the positive electrode side of the solar cell module 123 on the negative electrode 122 side of the solar cell module array 120 as described above (see FIG. 12). However, in a case where a voltage of a positive potential is applied to the light-receiving-side pinching electrode 26U while the solar cell module array 20 is not generating power and the rechargeable battery 30 is operating, Na ions that have been drawn toward the light-receiving-side pinching electrode 26U while the solar cell module array 20 is generating power can be moved away from the light-receiving-side pinching electrode 26U. Accordingly, PID is less likely to occur in a case where the photovoltaic system PVS is used for a long period.

In this photovoltaic system PVS, for PID to become likely to occur, there is no necessity for another power source for applying a voltage to the solar cell module array 20. Accordingly, the solar cell module array 20 can simply and efficiently make it difficult for PID to occur. Furthermore, since the photovoltaic system PVS has a simple system configuration, electric power consumption is also kept low, and power generation efficiency of the photovoltaic system PVS is improved accordingly.

Figure 5:
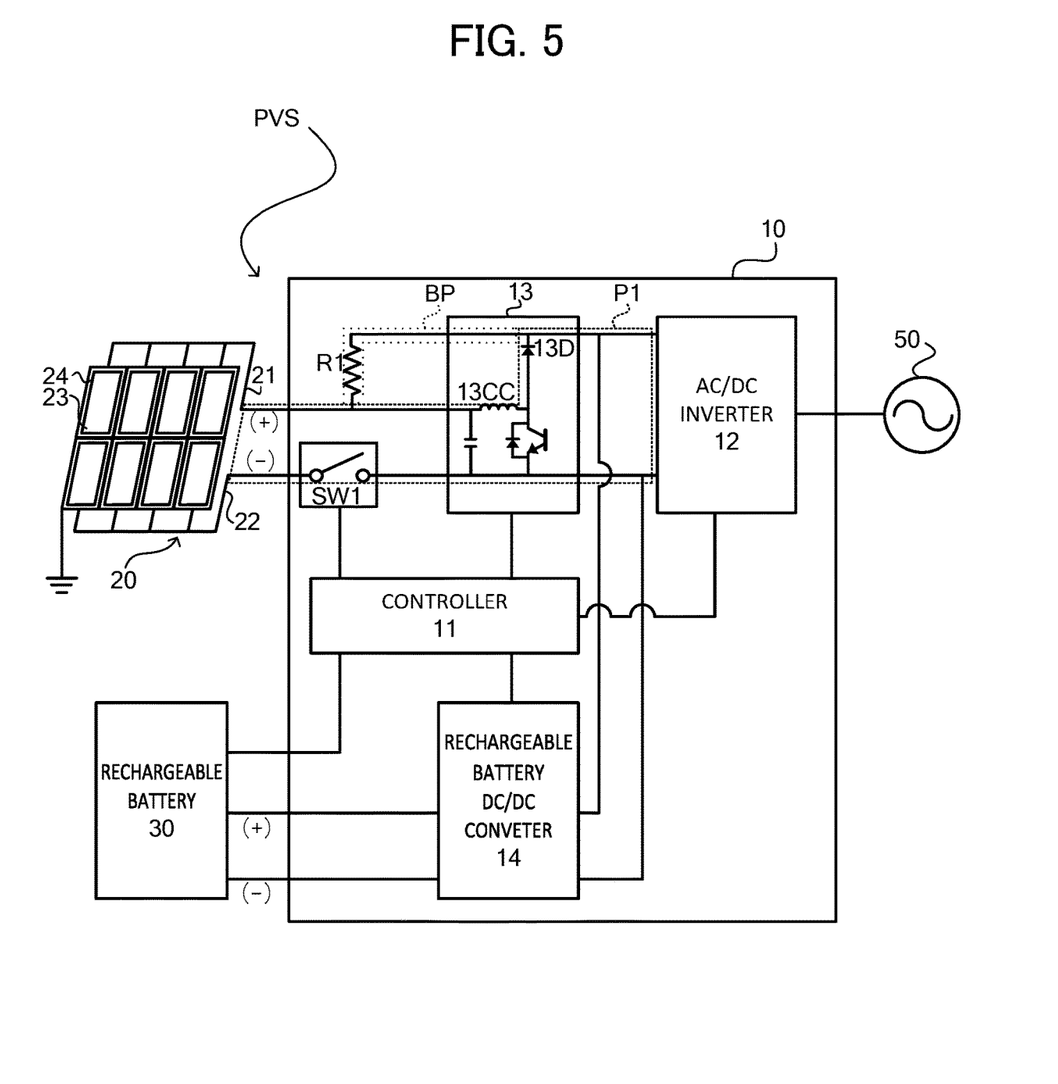
FIG. 5 is a block diagram of the photovoltaic system.

Although an example in which the second switching circuit SW2 is a voltage application circuit has been described above, this configuration is not restrictive, and a resistor R1 may be disposed on the bypass electric path BP instead of the second switching circuit SW2 as illustrated in FIG. 5.

The resistor R1 has a high resistance value (e.g., 10 MΩ) so as not to hinder operation of the solar cell converter 13 during power generation of the solar cell module array 20.

The first switching circuit SW1 operates in a manner similar to that in the photovoltaic system PVS of FIG. 1. Accordingly, the first switching circuit SW1 is in an "opened" state while the solar cell module array 20 is not generating power and the rechargeable battery 30 is operating (is being charged or discharged).

Figure 8:
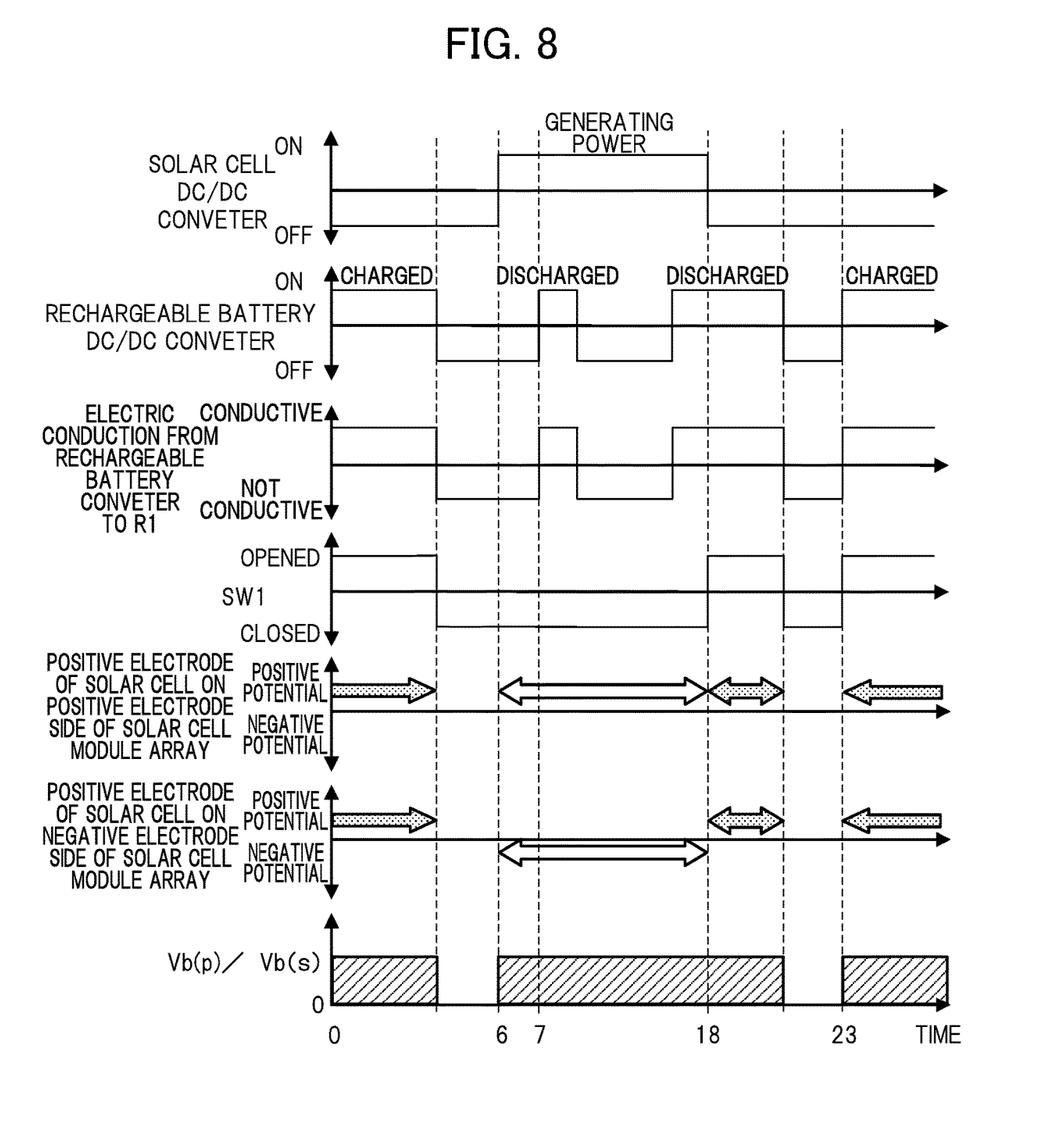
FIG. 8 is a timing diagram of the photovoltaic system of FIG. 5.

Note that opening-closing operation of the first switching circuit SW1 and the second switching circuit SW2 is controlled by the controller 11. More specifically, the controller 11 controls the first switching circuit SW1 to "open" upon detection of an OFF signal of the solar cell converter 13 and an ON signal of the rechargeable battery converter 14 as illustrated in FIG. 8.

Furthermore, the controller 11 controls the first switching circuit SW1 to "close" upon detection of other signals, that is, upon detection of an OFF signal of the solar cell converter 13 and an OFF signal of the rechargeable battery converter 14 or upon detection of an ON signal of the solar cell converter 13 and an ON signal or an OFF signal of the rechargeable battery converter 14.

Figure 6:
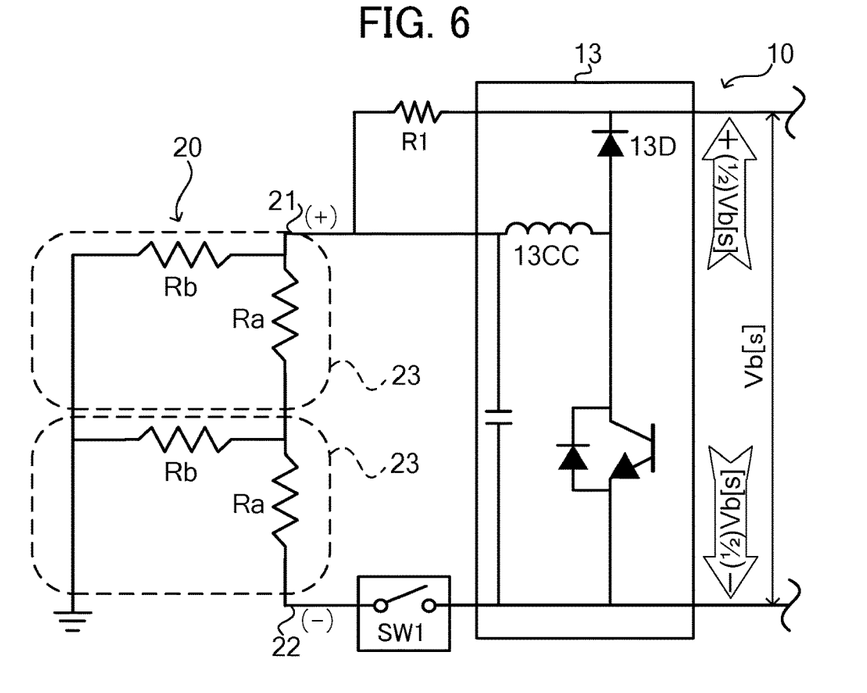
FIG. 6 is an electric circuit diagram of a part of the photovoltaic system of FIG. 5 (while the solar cell converter is not operating and the rechargeable battery converter is operating).

In a case where the first switching circuit SW1 and the resistor R1 are disposed and the first switching circuit SW1 is in an "opened" state while the solar cell module array 20 is not generating power and the rechargeable battery 30 is operating, a negative-electrode-side voltage to ground −(½)×Vb[s] of the base voltage Vb[s] is not applied to the negative electrode 22 of the solar cell module array 20 due to the "opened" state of the first switching circuit SW1 even in a case where the rechargeable battery converter (not illustrated) operates and a negative electrode potential is generated with respect to a ground potential, as illustrated in FIG. 6.

Meanwhile, a positive-electrode-side voltage to ground +(½)×Vb[s] of the base voltage Vb[s] is applied to the positive electrode 21 of the solar cell module array 20 through the resistor R1. That is, the positive electrode side voltage to ground +(½)×Vb[s] is divided by the resistor R1 and the resistor of the solar cell module array 20, and a positive-electrode-side voltage to ground divided by the resistors is applied to the light-receiving-side pinching electrode 26U of the solar cell module 23 on the positive electrode 21 side of the solar cell module array 20.

Figure 7:
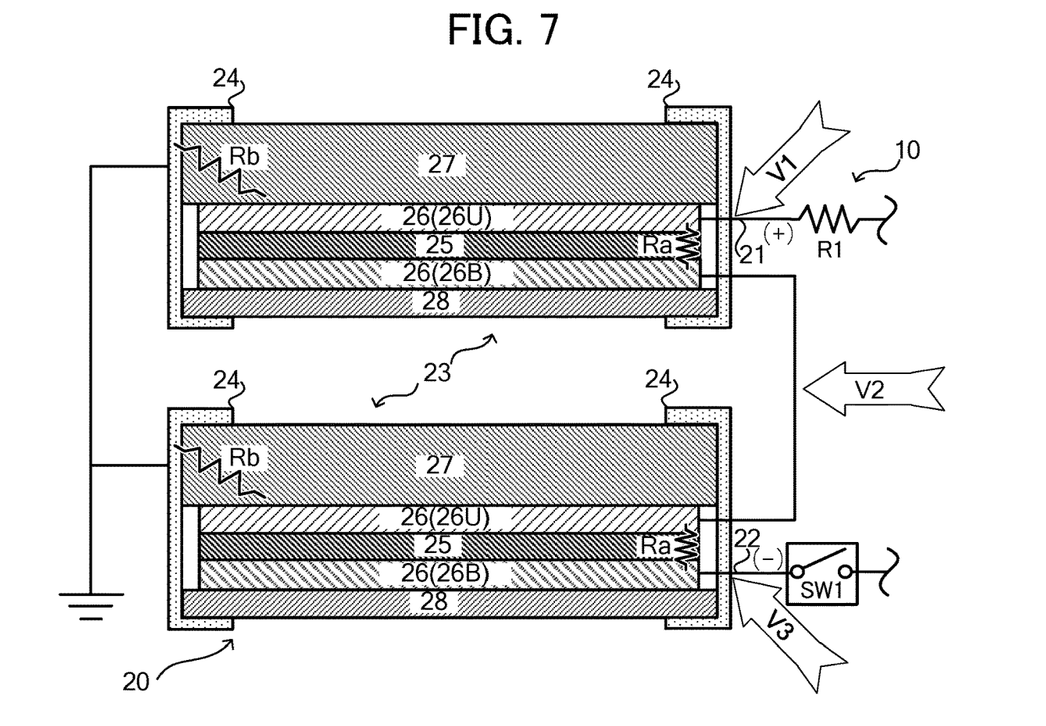
FIG. 7 is an explanatory view schematically illustrating solar cells in the electric circuit diagram illustrated in FIG. 6.

Accordingly, V1, V2, and V3 are as follows as illustrated in FIG. 7. In the following formula, Rc is combined resistance Rc [=Rb//(Ra+Rb)=Rb×(Ra+Rb)/(Ra+2Rb)], which is a combination of the resistor Ra and the resistor Rb of the solar cell module 23 on the positive electrode 21 side and the resistor Rb of the solar cell module 23 on the negative electrode 22 side in the solar cell module array 20. Furthermore, Vb[s]>0, R1>0, Ra>0, and Rb>0.

$$V1 = +(1/2) \times Vb[s] \times (Rc/(R1+Rc))$$
$$= +(1/2) \times Vb[s] \times ((Rb // (Ra+Rb))/(R1 + Rb // (Ra+Rb))) > 0$$
$$V2 = V1 \times (Rb/(Ra+Rb)) > 0$$
$$V3 = V1 \times (Rb/(Ra+Rb)) > 0$$

Since the first switching circuit SW1 is in an "opened" state, no electric current flows through the solar cell module 23 on the negative electrode 22 side of the solar cell module array 20. Accordingly, V3 on the negative electrode side of the solar cell module 23 on the negative electrode 22 side is the same as V2.

As described above, V1, V2, and V3 become positive. That is, the potential of the light-receiving-side pinching electrodes 26U of the plurality of solar cell modules 23 in the solar cell module array 20 becomes positive. As a result, the light-receiving-side pinching electrodes 26U do not draw sodium ions (Na+) of the glass substrate 27, and thereby PID becomes less likely to occur.

In other words, although the potential of the positive electrode 21 of the solar cell module array 20 becomes negative in a photovoltaic system in which the first switching circuit and the resistor R1 are not disposed, the resistor R1 efficiently serves a function of induction (voltage application) toward a positive potential. In this respect, the resistor R1 can be called a voltage application circuit.

In a case where the bypass electric path BP is disposed but the resistor R1 is not disposed, a voltage to ground of the solar cell module 23 is supposed to be a ground potential in an "opened" state of the first switching circuit SW1, but there may be influence of a commercial power source (60/50 Hz) around the solar cell module array 20 or an electric appliance close to the solar cell module array 20 due to very high resistance of the resistor Rb of the solar cell module 23. More specifically, a negative voltage is sometimes applied to the light-receiving-side pinching electrode 26U on the negative electrode 22 side of the solar cell module array 20, for example, through a floating capacitor generated between the solar cell module array 20 and the commercial power source or the electric appliance.

However, according to the photovoltaic system PVS of FIG. 5, the resistor R1 is disposed on the bypass electric path BP. Accordingly, a positive voltage is applied to the positive electrode 21 of the photovoltaic system PVS through the resistor R1 with certainty. Therefore, occurrence of PID is made less likely with certainty.

Note that the present invention is not limited to the above embodiment, and the above embodiment can be modified in various ways within the scope of the claims. That is, embodiments obtained by combining technical means changed as appropriate within the scope of the claims are also encompassed within the technical scope of the present invention.

EXPLANATION OF REFERENCE NUMERALS

PVS: photovoltaic system
SW1: first switching circuit
SW2: second switching circuit [voltage application circuit]
R1: resistor [voltage application circuit]
P1: first electric path
BP: bypass electric path
10: power conditioner
11: controller
12: AC/DC inverter
13: solar cell module array DC/DC converter
13D: diode [rectifying device]
13CC: choke coil
14: rechargeable battery DC/DC converter
20: solar cell module array
21: positive electrode of solar cell module array
22: negative electrode of solar cell module array
23: solar cell module
24: metal frame
25: photoelectric conversion substrate
26: pinching electrode
26U: light-receiving-side pinching electrode
26B: back-side pinching electrode
27: light-receiving-side protection member
28: back-side protection member
30: rechargeable battery

The invention claimed is:

1. A photovoltaic system comprising:
a solar cell module array;
a rechargeable battery that stores therein power supplied from the solar cell module array or a system power source; and
a power conditioner electrically connected to the solar cell module array and the rechargeable battery, wherein
the power conditioner includes an inverter that converts a direct current supplied from the solar cell module array or a direct current supplied from the rechargeable battery into an alternating current,
a bypass electric path that connects the inverter and a positive electrode of the solar cell module array is connected in parallel with a first electric path between the inverter and the solar cell module array,
a voltage application circuit that induces a potential of the positive electrode of the solar cell module array toward a positive potential at least while the solar cell module array is not generating power and the rechargeable battery is operating is provided on the bypass electric path, and the voltage application circuit is a switching circuit that is in a closed state while the solar cell module array is not generating power and the rechargeable battery is operating or the voltage application circuit is a resistive circuit.

2. A photovoltaic system comprising:

a solar cell module array;

a rechargeable battery that stores therein power supplied from the solar cell module array or a system power source; and a power conditioner electrically connected to the solar cell module array and the rechargeable battery, wherein the power conditioner includes an inverter that converts a direct current supplied from the solar cell module array or a direct current supplied from the rechargeable battery into an alternating current, a bypass electric path that connects the inverter and a positive electrode of the solar cell module array is connected in parallel with a first electric path between the inverter and the solar cell module array, a voltage application circuit that induces a potential of the positive electrode of the solar cell module array toward a positive potential at least while the solar cell module array is not generating power and the rechargeable battery is operating is provided on the bypass electric path, the voltage application circuit being a second switching circuit that is in a closed state while the solar cell module array is not generating power and the rechargeable battery is operating;

a first switching circuit that is in an opened state while the solar cell module array is not generating power and the rechargeable battery is operating is provided on an electric path that is a part of the first electric path and that is located between the inverter and a negative electrode of the solar cell module array;

a solar cell module array DC/DC converter;

a rechargeable battery DC/DC converter; and a controller that controls opening-closing operation of the first switching circuit and the second switching circuit, wherein the controller controls the first switching circuit to open and controls the second switching circuit to close upon detection of an OFF signal of the solar cell module array DC/DC converter and an ON signal of the rechargeable battery DC/DC converter.

3. A photovoltaic system comprising:

a solar cell module array;

a rechargeable battery that stores therein power supplied from the solar cell module array or a system power source; and a power conditioner electrically connected to the solar cell module array and the rechargeable battery, wherein the power conditioner includes an inverter that converts a direct current supplied from the solar cell module array or a direct current supplied from the rechargeable battery into an alternating current, a bypass electric path that connects the inverter and a positive electrode of the solar cell module array is connected in parallel with a first electric path between the inverter and the solar cell module array, a voltage application circuit which is a resistive circuit that induces a potential of the positive electrode of the solar cell module array toward a positive potential at least while the solar cell module array is not generating power and the rechargeable battery is operating is provided on the bypass electric path;

a first switching circuit that is in an opened state while the solar cell module array is not generating power and the rechargeable battery is operating is provided on an electric path that is a part of the first electric path and that is located between the inverter and a negative electrode of the solar cell module array;

a solar cell module array DC/DC converter;

a rechargeable battery DC/DC converter; and a controller that controls opening-closing operation of the first switching circuit, wherein the controller controls the first switching circuit to open upon detection of an OFF signal of the solar cell module array DC/DC converter and an ON signal of the rechargeable battery DC/DC converter.

\* \* \* \* \*